United States Patent
Chiu et al.

(10) Patent No.: US 9,224,847 B2
(45) Date of Patent: Dec. 29, 2015

(54) HIGH ELECTRON MOBILITY TRANSISTOR AND METHOD OF FORMING THE SAME

(71) Applicant: Taiwan Semiconductor Manufacturing Company, Ltd., Hsin-Chu (TW)

(72) Inventors: Han-Chin Chiu, Kaohsiung (TW); Po-Chun Liu, Hsin-Chu (TW); Chi-Ming Chen, Zhubei (TW); Chung-Yi Yu, Hsin-Chu (TW); King-Yuen Wong, Tuen Mun (HK)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/329,077

(22) Filed: Jul. 11, 2014

(65) Prior Publication Data

US 2014/0319583 A1   Oct. 30, 2014

Related U.S. Application Data

(63) Continuation of application No. 13/769,785, filed on Feb. 18, 2013, now Pat. No. 8,803,158.

(51) Int. Cl.
*H01L 21/28* (2006.01)
*H01L 21/3205* (2006.01)
*H01L 29/778* (2006.01)
(Continued)

(52) U.S. Cl.
CPC ........ *H01L 29/7787* (2013.01); *H01L 29/1029* (2013.01); *H01L 29/1033* (2013.01); *H01L 29/1075* (2013.01); *H01L 29/2003* (2013.01);
(Continued)

(58) Field of Classification Search
CPC .................. H01L 21/28556; H01L 21/28255; H01L 21/28194; H01L 21/2255; H01L 21/242; H01L 21/2022; H01L 21/2015; H01L 27/1104; H01L 29/435; H01L 29/778; H01L 29/7781; H01L 29/7782; H01L 29/7783; H01L 51/102; H01L 51/14226; H01L 51/4226; H01L 45/1616
USPC ......... 438/602, 603, 604, 700, 197, 680, 678, 438/637, 270; 257/E21.006, E21.051, 257/E21.121, E21.126, E21.127, E21.129, 257/E21.17, E21.217, E21.267, E21.246, 257/E21.252, E21.403
See application file for complete search history.

(56) References Cited

U.S. PATENT DOCUMENTS 5,132,746 A * 7/1992 Mendez et al. ................. 257/25
5,281,543 A * 1/1994 Fukuzawa et al. ............ 438/186

(Continued)

OTHER PUBLICATIONS

Huang, S. et al., "ALD-grown Ultrathin AlN Film for Passivation of AlGaN/GaN HEMTs," CS MANTECH Conference, Apr. 23-26, 2012, Boston, Massachusetts, 4 pages.

(Continued)

*Primary Examiner* — David Nhu
(74) *Attorney, Agent, or Firm* — Slater & Matsil, L.L.P.

(57) ABSTRACT

A High Electron Mobility Transistor (HEMT) includes a first III-V compound layer having a first band gap, and a second III-V compound layer having a second band gap over the first III-V compound layer. The second band gap is greater than the first band gap. A crystalline interfacial layer is overlying and in contact with the second III-V compound layer. A gate dielectric is over the crystalline interfacial layer. A gate electrode is over the gate dielectric. A source region and a drain region are over the second III-V compound layer, and are on opposite sides of the gate electrode.

20 Claims, 9 Drawing Sheets

(51) Int. Cl.
*H01L 29/20* (2006.01)
*H01L 29/66* (2006.01)
*H01L 29/423* (2006.01)
*H01L 29/10* (2006.01)

(52) U.S. Cl.
CPC .... *H01L 29/42364* (2013.01); *H01L 29/66462* (2013.01)

(56) References Cited

U.S. PATENT DOCUMENTS

| | | | |
|---|---|---|---|
| 5,942,447 A | 8/1999 | Miyakuni | |
| 7,893,463 B2 | 2/2011 | Cooke et al. | |
| 8,232,581 B2 | 7/2012 | Pourtois et al. | |
| 8,309,990 B2 | 11/2012 | Cooke et al. | |
| 8,314,017 B2 | 11/2012 | Merckling | |
| 8,507,920 B2 | 8/2013 | Chen et al. | |
| 8,624,296 B1 | 1/2014 | Wong et al. | |
| 8,803,158 B1 * | 8/2014 | Chiu et al. | 257/76 |

OTHER PUBLICATIONS

Selvaraj, S. et al., "AlN/GaN metal-insulator-semiconductor high-electron-mobility transistor on 4in. silicon substrate for high breakdown characteristics," Applied Physics Letters 90, American Institute of Physics, 2007, 3 pages.

\* cited by examiner

HIGH ELECTRON MOBILITY TRANSISTOR AND METHOD OF FORMING THE SAME

PRIORITY CLAIM AND CROSS-REFERENCE

This application is a continuation of U.S. patent application Ser. No. 13/769,785, entitled "High Electron Mobility Transistor and Method of Forming the Same," filed on Feb. 18, 2013, now U.S. Pat. No. 8,803,158, which application is incorporated herein by reference.

BACKGROUND

In semiconductor technology, due to the high mobility values, Group III-Group V (or III-V) semiconductor compounds are used to form various integrated circuit devices, such as high power field-effect transistors, high frequency transistors, and High Electron Mobility Transistors (HEMTs). A HEMT is a field effect transistor incorporating a 2-Dimensional Electron Gas (2DEG) layer close to the junction between two materials with different band gaps (i.e., a heterojunction). The 2DEG layer, instead of a doped region as is generally the case for Metal Oxide Semiconductor Field Effect Transistors (MOSFETs), acts as the channel. In contrast with the MOSFETs, the HEMTs have a number of attractive properties including high electron mobility, the ability to transmit signals at high frequencies, etc.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A High Electron Mobility Transistor (HEMT) and the method of forming the same are provided in accordance with various exemplary embodiments. The intermediate stages of forming the HEMT are illustrated. The variations of the embodiments are discussed. Throughout the various views and illustrative embodiments, like reference numbers are used to designate like elements. The process for forming the HEMT may be found referring to the exemplary process flow 100 shown in FIG. 10. Additional process steps may be provided before, during, or after process 100 in FIG. 10. Various figures have been simplified for a better understanding of the concepts of the present disclosure.

Figure 1:
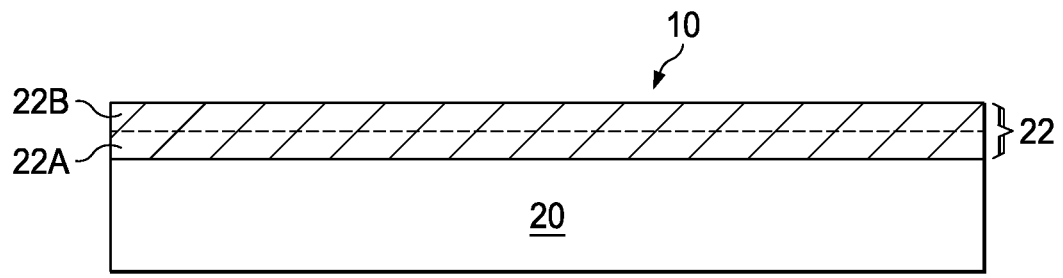
FIGS. 1 through 9 are cross-sectional views of intermediate stages in the manufacturing of a High Electron Mobility Transistor (HEMT) in accordance with some exemplary embodiments.

FIGS. 1 through 9 illustrate the cross-sectional views of intermediate stages in the formation of an HEMT in accordance with exemplary embodiments. The HEMT is formed using a gate first approach, in which a gate electrode is formed before the formation of source and drain regions. Referring to FIG. 1, which is a cross-sectional view of a portion of substrate 20, substrate 20 may be a part of wafer 10. In some embodiments, substrate 20 includes a silicon carbide (SiC) substrate, a sapphire substrate, a silicon substrate, or the like. Substrate 20 may be a bulk substrate formed of a bulk material, or may be a composite substrate including a plurality of layers that are formed of different materials.

In accordance with some embodiments, buffer layer 22 is first formed over substrate 20, which acts as the buffer and/or the transition layer for the subsequently formed overlying layers. The respective step is shown as step 101 in FIG. 10. Buffer layer 22 may be epitaxially grown using Metal Organic Vapor Phase Epitaxy (MOVPE). Buffer layer 22 may function as an interface to reduce lattice mismatch between substrate 20 and the subsequently formed III-V compound layers 26 (FIG. 3) and 28 (FIG. 4). In some embodiments, buffer layer 22 includes an aluminum nitride (AlN) layer having a thickness in a range between about 10 nanometers (nm) and about 300 nm. Buffer layer 22 may include a single layer or a plurality of layers. For example, buffer layer 22 may include low-temperature AlN layer 22A formed at a temperature between about 800° C. and about 1,200° C., and high-temperature AlN layer 22B formed at a temperature between about 1,000° C. and about 1,400° C. In some embodiments, buffer layer 22A has a thickness in a range between about 10 nanometers (nm) and about 100 nm, and buffer layer 22B has a thickness in a range between about 100 nanometers (nm) and about 200 nm.

Figure 2:
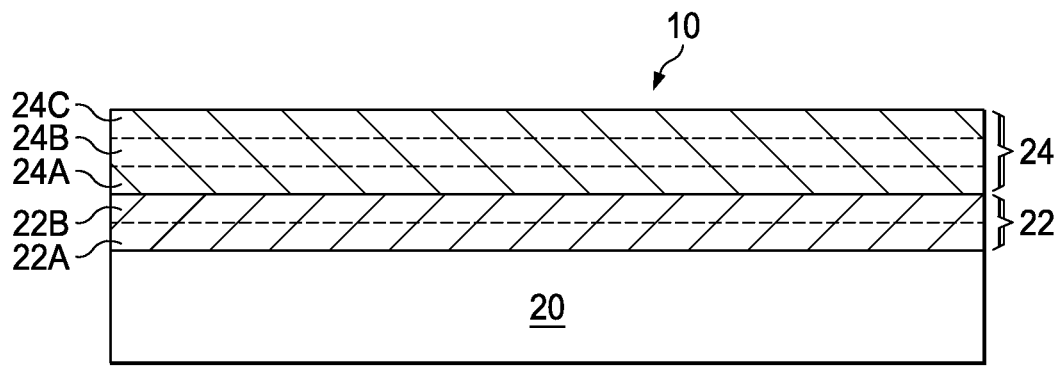

Referring to FIG. 2, III-V compound layer 24 is formed over buffer layer 22. The respective step is also shown as step 101 in FIG. 10. III-V compound layer 24 may also act as a buffer layer, and hence is referred to as buffer layer 24 hereinafter. Buffer layer 24 can be epitaxially grown using MOVPE, for example. Buffer layer 24 may include an aluminum gallium nitride (AlGaN) layer, which may have a thickness in a range from about 500 nm to about 1,000 nm. Buffer layer 24 may be a graded buffer layer, which means that the relative amounts of the respective aluminum and/or gallium content change with depth in the layer throughout a part or the total thickness of buffer layer 24. The relative amounts may change gradually to reduce the lattice parameter with the distance from substrate 20. For example, FIG. 2 schematically illustrated three sub layers 24A, 24B, and 24C, with the percentages of aluminum and/or gallium in sub layers 24A, 24B, and 24C different from each other. In some exemplary embodiments, sub layer 24A has an aluminum percentage between about 65 percent and about 85 percent, sub layer 24B has an aluminum percentage between about 35 percent and about 60 percent, and sub layer 24C has an aluminum percentage between about 10 percent and about 30 percent.

Figure 3:
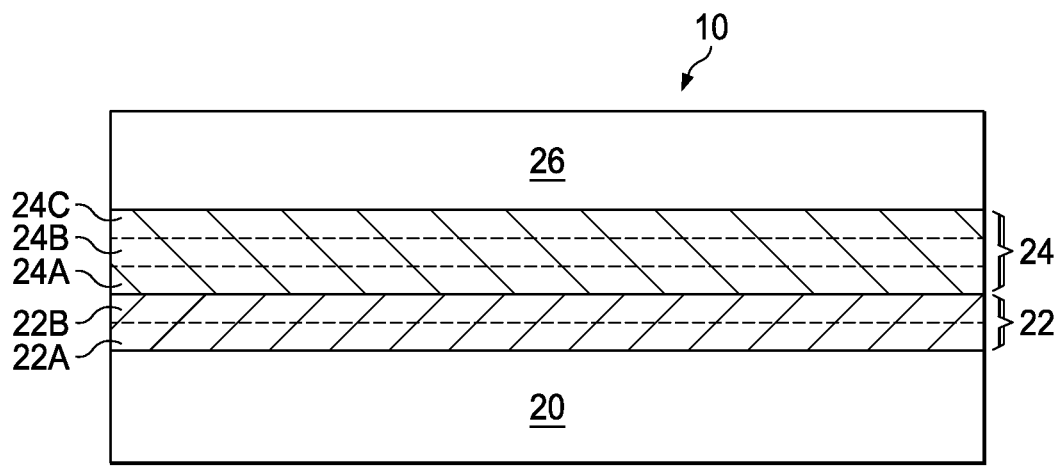
Figure 4:
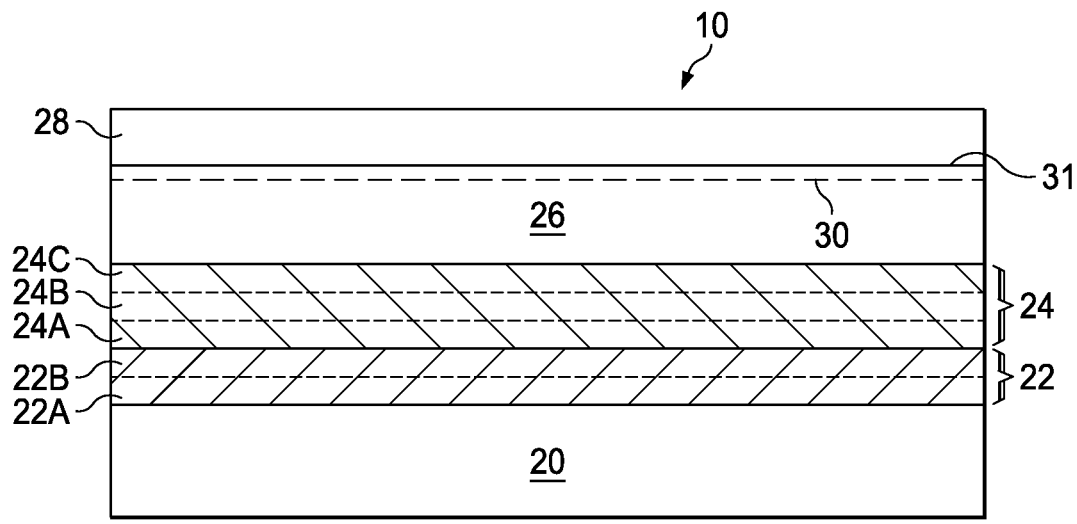
Figure 10:
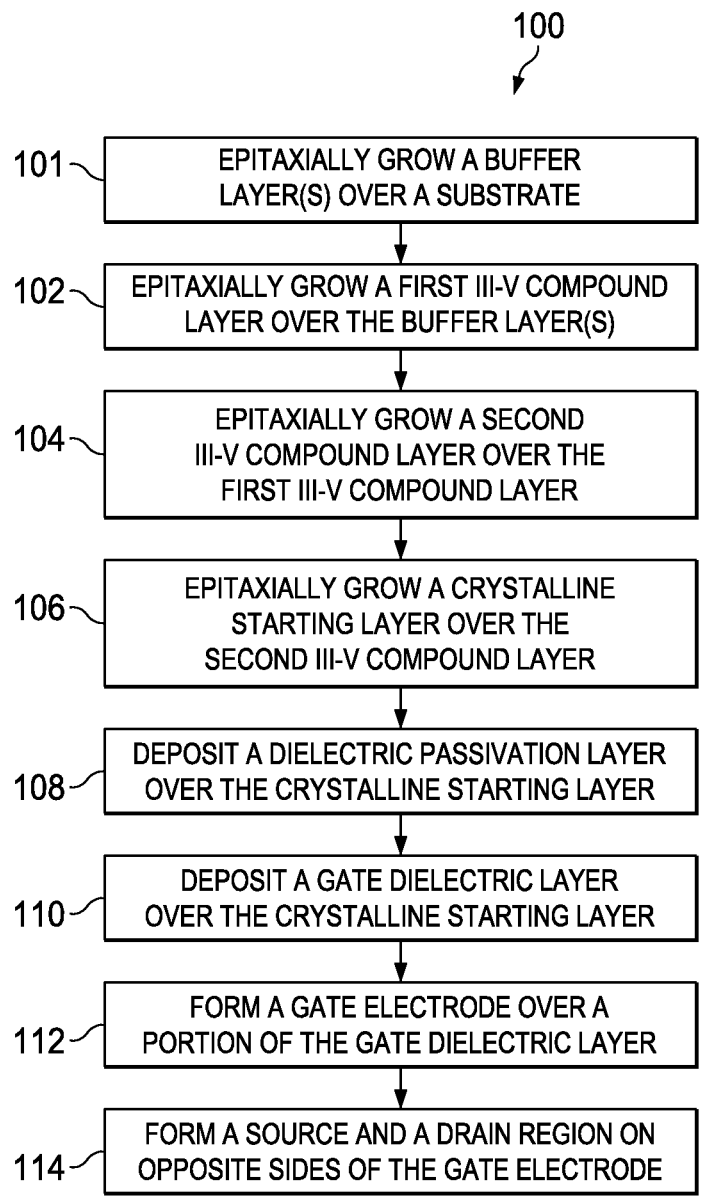
FIG. 10 illustrates a schematic process flow for forming the HEMT in accordance with exemplary embodiments.

Referring to FIG. 3, first III-V compound layer 26 is grown over buffer layer 24 (step 102 in FIG. 10). In some embodiments, III-V compound layer 26 is a gallium nitride (GaN) layer. GaN layer 26 may be epitaxially grown by using, for example, MOVPE, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiarybutylamine (TBAm), phenyl hydrazine, or other suitable chemicals. In some exemplary embodiments, III-V compound layer 26 has a thickness ranging from about 0.5 micron to about 10 microns. III-V compound layer 26 may be undoped. Alternatively, III-V compound layer 26 is unintentionally doped, such as lightly doped with n-type dopants due to a precursor used for forming III-V compound layer 26, with no dopant that may cause III-V compound layer 26 to be n-type or p-type intentionally added.

Referring to FIG. 4, a second III-V compound layer 28 is grown on, and may contact, III-V compound layer 26. The respective step is shown as step 104 in FIG. 10. III-V compound layer 28 has a band gap greater than the band gap of III-V compound layer 26. An interface 31 is formed between III-V compound layer 26 and III-V compound layer 28. When the respective HEMT is operated, carrier channel 30, which is known as a Two-Dimensional Electron Gas (2DEG), is formed and located in III-V compound layer 26 near interface 31. In some embodiments, III-V compound layer 28 is an AlGaN layer.

III-V compound layer 28 may be epitaxially grown over III-V compound layer 26 through MOVPE, for example. When formed of AlGaN, III-V compound layer 28 may be grown using an aluminum-containing precursor, a gallium-containing precursor, and a nitrogen-containing precursor. The aluminum-containing precursor may include trimethylaluminum (TMA), triethylaluminium (TEA), or other suitable chemicals. The gallium-containing precursor and the nitrogen-containing precursor may be selected from the same candidate precursors used for forming GaN layer 26. In some exemplary embodiments, AlGaN layer 28 has a thickness ranging from about 3 nm to about 50 nm.

Figure 5:
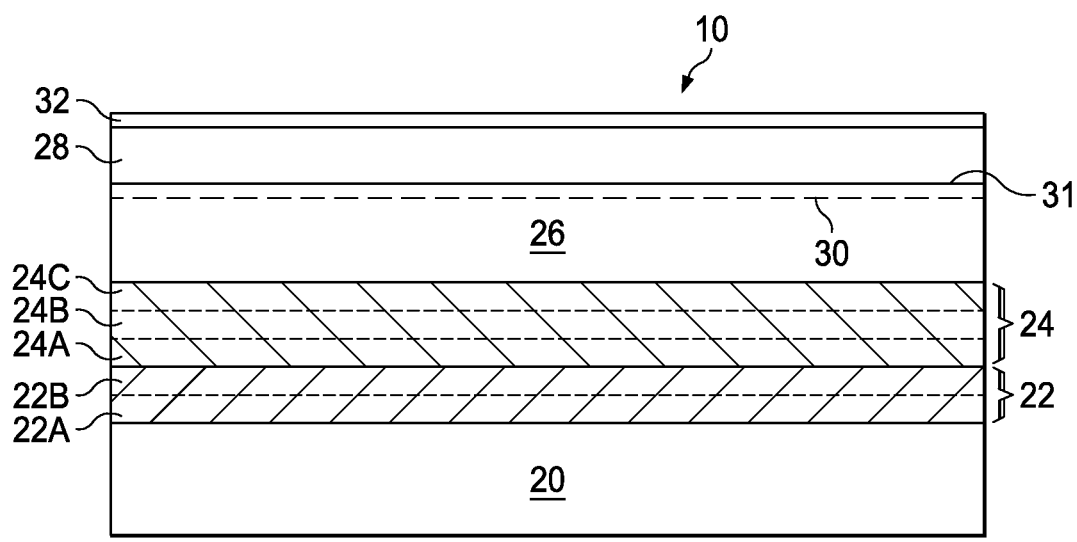

FIG. 5 illustrates the formation of crystalline interfacial layer 32. The respective step is shown as step 106 in FIG. 10. Crystalline interfacial layer 32 may have a single crystalline structure, or may have a polycrystalline structure. In some embodiments, crystalline interfacial layer 32 comprises a dielectric material, or comprises a semiconductor material with a relatively high resistivity and a relatively high band gap. In some exemplary embodiments, the band gap of crystalline interfacial layer 32 is higher than the band gap of III-V compound layer 26 (such as GaN). Furthermore, in some embodiments, the band gap of crystalline interfacial layer 32 is higher than the band gaps of III-V compound layers 28 (such as AlGaN) and 26, although other materials with lower band gaps may also be used. In the embodiments that crystalline interfacial layer 32 comprises a semiconductor material, the respective semiconductor material may be selected from AlN, $In_xAl_yGa_zN$ (with x+y+z=1, and 0≤x, y, and z≤1), or the like. In the embodiments that crystalline interfacial layer 32 comprises a dielectric material, the respective dielectric material may be selected from $SiN_x$, $SiO_x$, $Al_2O_3$, MgO, $Ga_2O_3$, $La_2O_3$, $HfO_2$, $ZrO_2$, $Y_2O_3$, $Gd_2O_3$, $Ce_2O_3$, $Ta_2O_3$, $Ta_2O_5$, combinations thereof, and multi-layers thereof.

Crystalline interfacial layer 32 may be formed using MOCVD, Atomic Layer Deposition (ALD), Physical Vapor Deposition (PVD), or the like. The process condition for forming crystalline interfacial layer 32 is controlled, so that crystalline interfacial layer 32 has a good crystalline structure, for example, with a single-crystalline structure or at least poly-crystalline structure. With crystalline interfacial layer 32 having a good crystalline structure, the bonding between the atoms of crystalline interfacial layer 32 is strong. As a result, the Interfacial Density of States (Dit) at the interface between crystalline interfacial layer 32 and III-V compound layer 28 is low. The resulting HEMT 42 (FIG. 9) thus has a small threshold voltage (Vt) shift, and the reliability of HEMT 42 is improved. The appropriate process conditions for forming the crystalline structure may include, for example, increasing the deposition temperature to 500° C. or higher.

In some exemplary embodiments, crystalline interfacial layer 32 may be formed in-situ with the formation of III-V compound layer 28 in a same process chamber, with no vacuum break occurring between the formation of III-V compound layer 28 and the formation of crystalline interfacial layer 32. In alternative embodiments, crystalline interfacial layer 32 is formed ex-situ with the formation of III-V compound layer 28, for example, in different process chambers.

Crystalline interfacial layer 32 may be formed as a crystalline layer as deposited, or may be formed as a poly-crystalline layer or near-amorphous layer, and is subsequently re-crystallized through a high-temperature annealing. The high-temperature annealing may be performed with an annealing temperature greater than the re-crystallization temperature of the deposited layer (re-crystallization temperature depends on the deposited layer species, and may be higher than 550° C., for example, for $HfO_2$). Crystalline interfacial layer 32 may have a thickness between about 2 Å and about 100 Å, although different thicknesses may be used.

Figure 6:
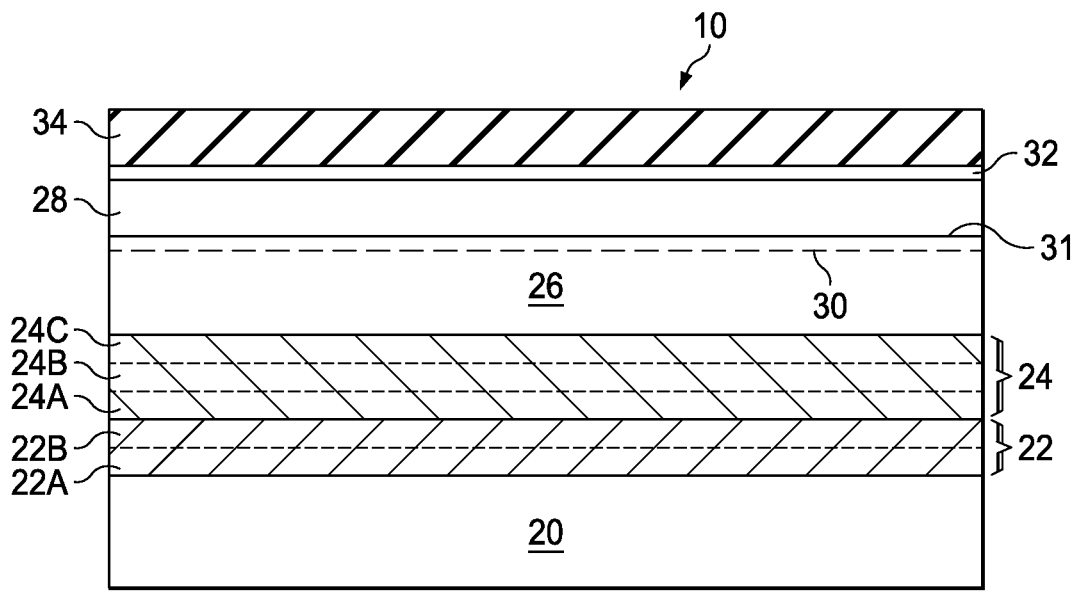

Next, as shown in FIG. 6, dielectric passivation layer 34 is deposited (step 108 in FIG. 10) over, and may contact, a top surface of crystalline interfacial layer 32. In some exemplary embodiments, dielectric passivation layer 34 has a thickness in a range from about 100 Å to about 5,000 Å. An exemplary dielectric passivation layer 34 includes silicon oxide and/or silicon nitride. When comprising silicon nitride, dielectric passivation layer 34 may be formed by performing a Low-Pressure Chemical Vapor Deposition (LPCVD) method (without plasma) using $SiH_4$ and $NH_3$ gases. Dielectric passivation layer 34 protects the underlying crystalline interfacial layer 32 and III-V compound layer 28 from the damage caused by plasma, which plasma is generated in the following processes.

Figure 7:
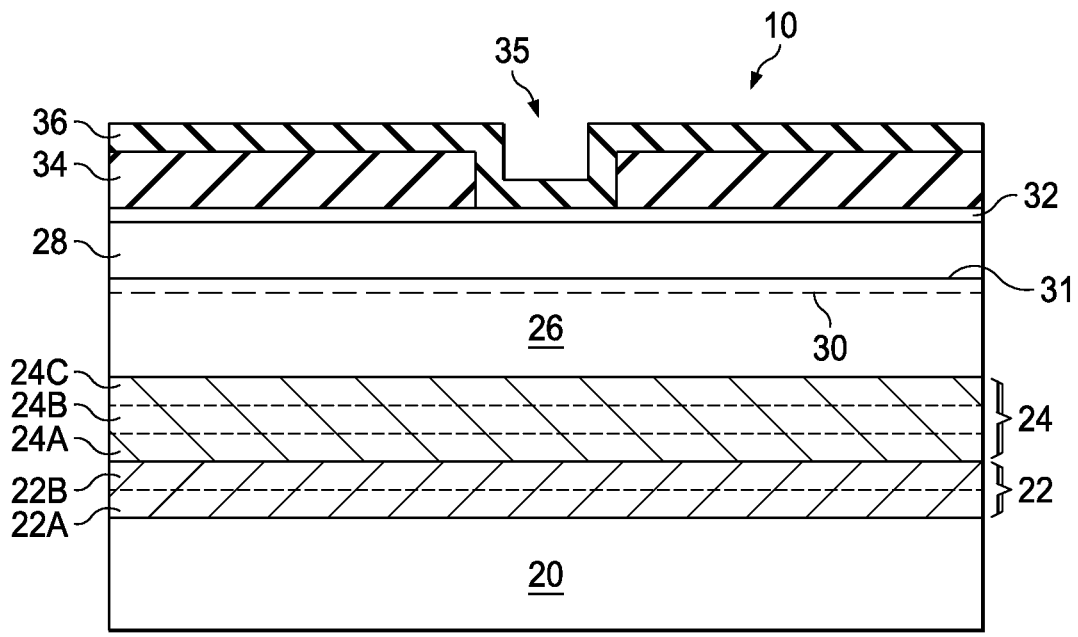

Next, referring to FIG. 7, opening 35 is formed in dielectric passivation layer 34, for example, through etching. A portion of the top surface of crystalline interfacial layer 32 is thus exposed. In some examples, dielectric passivation layer 34 comprises silicon nitride, and opening 35 is formed in a dry etching environment including $BCl_3$, for example, as the etchant gas.

Further referring to 7, in some embodiments, gate dielectric layer 36 is deposited over dielectric passivation layer 34 (step 110 in FIG. 10). Gate dielectric layer 36 also extends into opening 35, and hence includes a portion overlapping and contacting crystalline interfacial layer 32. Furthermore, gate dielectric layer 36 includes portions on the sidewalls of dielectric passivation layer 34, and portions overlapping dielectric passivation layer 34. Gate dielectric layer 36 may reduce a leakage current from the respective gate electrode 38 (FIG. 9) to III-V compound layer 28. As a result, the resulting HEMT 42 (FIG. 9) could be operated under high operation voltages for various applications.

In some embodiments, gate dielectric layer 36 has a thickness range from about 3 nm to about 50 nm. The exemplary materials of gate dielectric layer 36 may be selected from silicon oxide, silicon nitride, gallium oxide, aluminum oxide, scandium oxide, zirconium oxide, lanthanum oxide, hafnium oxide, and combinations thereof. Gate dielectric layer 36 may have an amorphous structure in order to reduce the leakage current flowing through gate dielectric layer 36, wherein the amorphous structure is formed through adjusting process conditions. In some embodiments, gate dielectric layer 36 is formed using Atomic Layer Deposition (ALD). In other embodiments, gate dielectric layer 36 is formed using Plasma Enhanced Chemical Vapor Deposition (PECVD) or LPCVD. The gate dielectric layer 36 is formed in an amorphous or non-crystallization structure which may be formed in a lower temperature than crystalline interfacial layer 32.

Figure 8:
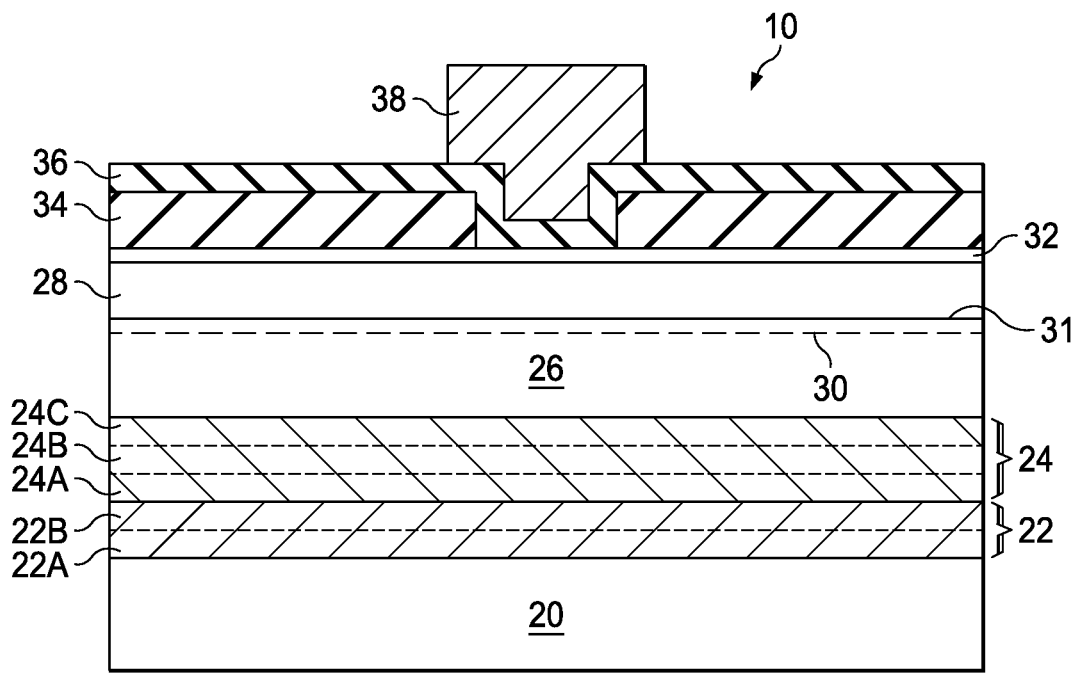

FIG. 8 illustrates a cross-sectional view the wafer 10 after the formation of gate electrode 38 over gate dielectric layer 36 (step 112 in FIG. 10). Gate electrode 38 comprises a portion extending into opening 35 (FIG. 7), and may further include portions overlapping dielectric passivation layer 34 and gate dielectric 36. Gate dielectric layer 36 thus separates gate electrode 38 from dielectric passivation layer 34 and crystalline interfacial layer 32. In some embodiments, the formation of gate electrode 38 includes depositing a blanket gate electrode layer over gate dielectric layer 36 and filling opening 35 shown in FIG. 7, and performing lithography and etching processes on the gate electrode layer to define gate electrode 38. In some embodiments, gate electrode 38 includes a conductive material layer that includes a refractory metal or the respective compounds including, e.g., titanium (Ti), titanium nitride (TiN), titanium tungsten (TiW), Tantalum (Ta), Tantalum nitride (TaN), and tungsten (W). In other examples, gate electrode 38 includes nickel (Ni), gold (Au), copper (Cu), or the alloys thereof.

Figure 9:
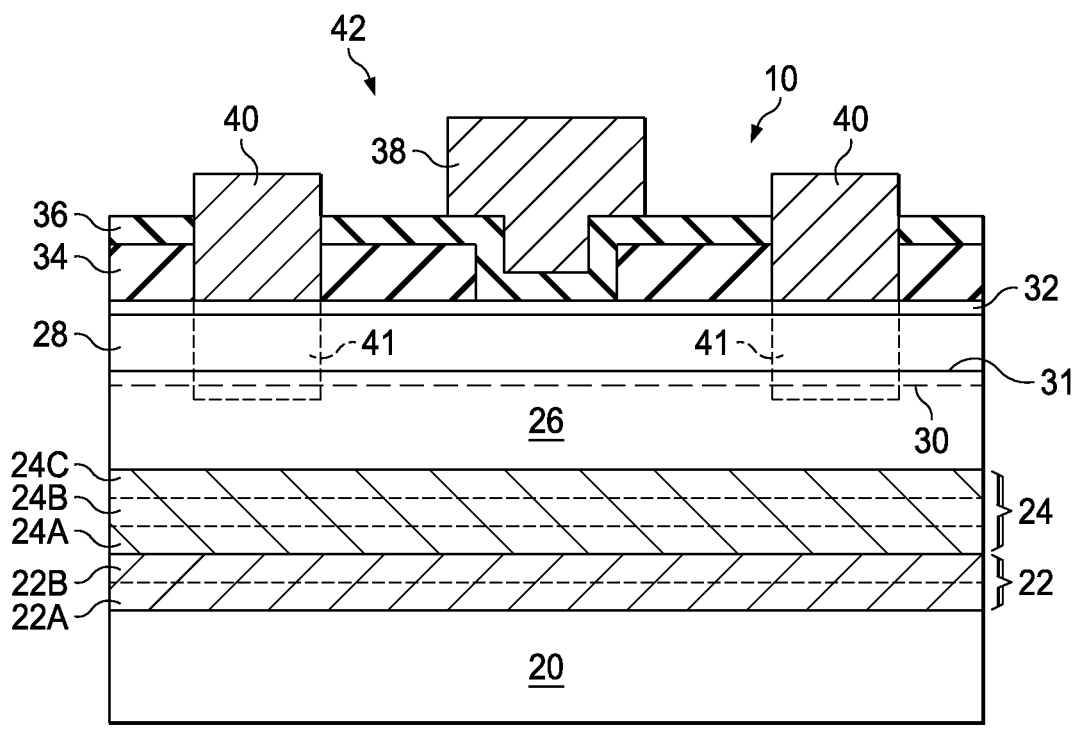

FIG. 9 illustrates a cross-sectional view of wafer 10 after metal features 40 are formed (step 114 in FIG. 10). Two openings (occupied by metal features 40) are formed on the opposite sides of gate electrode 38, for example, by lithography and etching processes performed on gate dielectric layer 36, dielectric passivation layer 34, and crystalline interfacial layer 32. The portions of III-V compound layer 28 on opposite sides of gate electrode 38 are thus exposed. In some exemplary formation process of metal features 40, a metal layer (not shown) is deposited over gate dielectric layer 36 (and dielectric passivation layer 34), which metal layer fills the openings in dielectric layer 36, dielectric passivation layer 34, and crystalline interfacial layer 32. The metal layer further contacts III-V compound layer 28 and possibly an underlying layer(s). A photoresist layer (not shown) is formed over the metal layer and then patterned. The patterned photoresist layer is then used as an etching mask to pattern the metal layer down to the underlying gate dielectric layer 36 or dielectric passivation layer 34. The remaining portions of the metal layer are metal features 40. The photoresist layer is removed after the formation of the metal features 40. Metal features 40 are configured as at least parts of the source and drain regions of the resulting HEMT 42. In the above described embodiments, gate dielectric 36, gate electrode 38, metal features 40, and carrier channel 30 form HEMT 42. When a voltage is applied to gate electrode 38, a device current may be modulated.

In some embodiments, metal features 40 include one or more conductive materials. For example, metal features 40 may comprise Ti, Co, Ni, W, Pt, Ta, Pd, Mo, TiN, an AlCu alloy, and alloys thereof. In other examples, each of metal features 40 includes a bottom Ti/TiN layer, an AlCu layer overlying the bottom Ti/TiN layer, and a top Ti layer overlying the AlCu layer. The formation methods of the metal layer include ALD or PVD processes. In some embodiments, a thermal annealing process is applied to metal features 40 such that metal features 40 react with III-V compound layer 28 and III-V compound layer 26 to form inter-metallic compound 41. Inter-metallic compound 41 (which also forms parts of the source and drain regions of HEMT 42) thus connects to the opposite ends of channel 30, and provides for more effective electrical connection to carrier channel 30.

A band gap discontinuity exists between III-V compound layer 28 and III-V compound layer 26, creating the very thin layer 30 of highly mobile conducting electrons in III-V compound layer 26. This thin layer 30 is referred to as a Two-Dimensional Electron Gas (2DEG), which is schematically illustrated. 2DEG 30 forms the carrier channel, which is the channel of HEMT 42. The carrier channel of 2DEG is located in III-V compound layer 26 and near interface 31 between III-V compound layer 28 and III-V compound layer 26. The carrier channel has high electron mobility partly because III-V compound layer 26 is undoped or unintentionally doped, and the electrons can move freely without collision or with substantially reduced collisions with impurities.

FIGS. 11 through 17 illustrate cross-sectional views of intermediate stages in the formation of HEMTs in accordance with alternative embodiments. Unless specified otherwise, the materials and formation methods of the components in these embodiments are essentially the same as the like components, which are denoted by like reference numerals in the embodiments shown in FIGS. 1 through 9. The details regarding the formation process and the materials of the components shown in FIGS. 11 through 17 may thus be found in the discussion of the embodiment shown in FIGS. 1 through 9.

Figure 11:
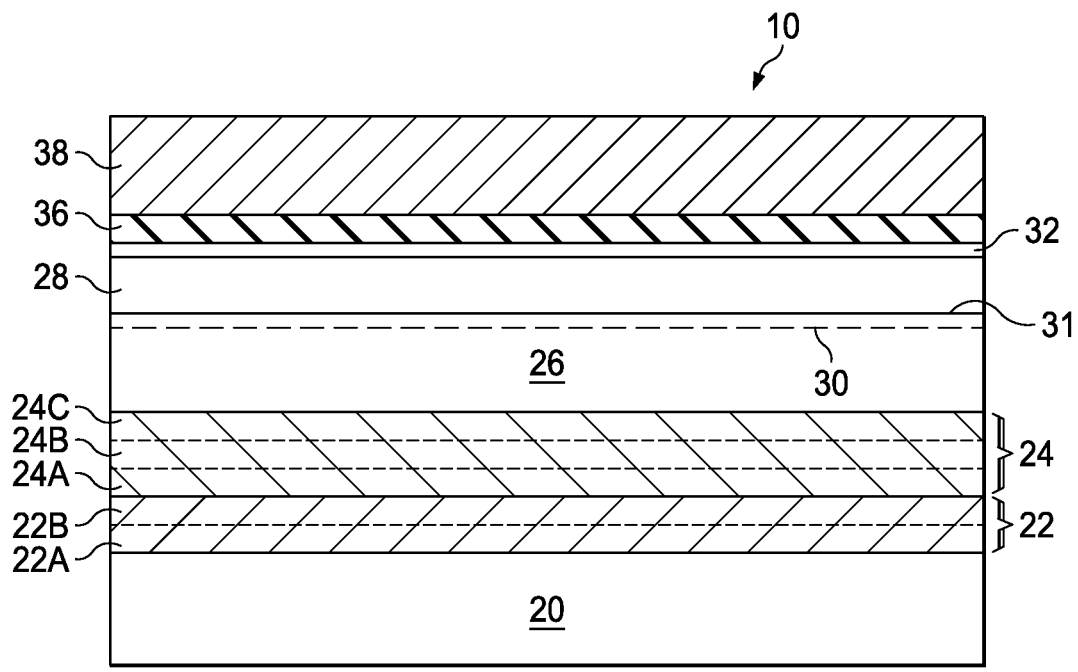
FIGS. 11 through 17 are cross-sectional views of intermediate stages in the manufacturing of HEMTs in accordance with alternative embodiments.
Figure 12:
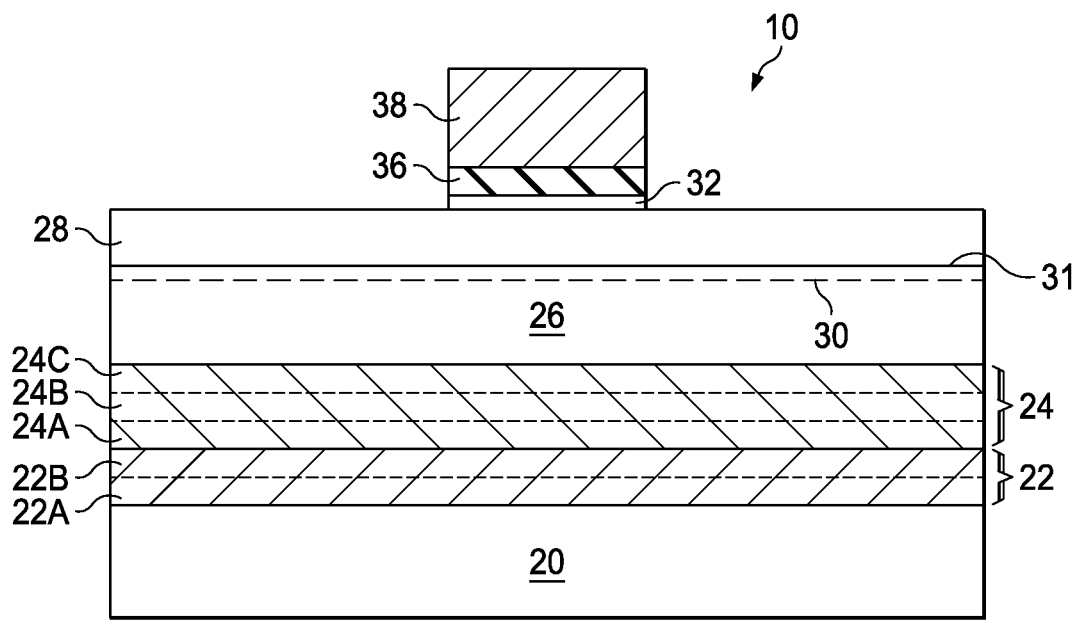
Figure 13:
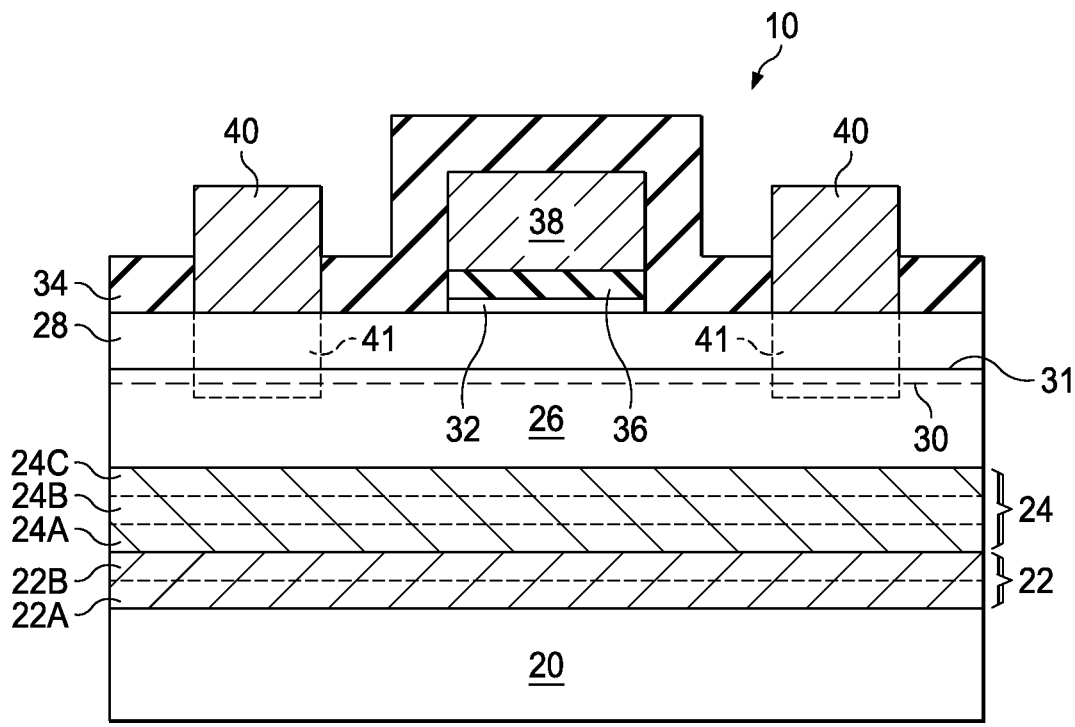

FIGS. 11 through 13 illustrate cross-sectional views of intermediate stages in the formation of an HEMT using another gate first approach. The initial steps of these embodiments are essentially the same as shown in FIGS. 1 through 5, and hence the details of the formation processes are not repeated herein. Next, as shown in FIG. 11, gate dielectric layer 36 and gate electrode layer 38 are formed. Gate dielectric layer 36 is over, and may be in contact with, crystalline interfacial layer 32.

FIG. 12 illustrates the patterning of gate electrode layer 38, gate dielectric layer 36, and crystalline interfacial layer 32, whose remaining portions are also referred to as gate electrode 38, gate dielectric 36, and crystalline interfacial layer 32, respectively. Gate electrode 38, gate dielectric 36, and crystalline interfacial layer 32 are co-terminus, which means that the respective edges of gate electrode 38, gate dielectric 36, and crystalline interfacial layer 32 are aligned with each other.

FIG. 13 illustrates the formation of dielectric passivation layer 34 and metal features 40. Dielectric passivation layer 34 comprises a top portion overlapping gate electrode 38, sidewall portions on the edges of gate electrode 38, gate dielectric 36, and crystalline interfacial layer 32, and horizontal portions on the top surface of III-V compound layer 28. Metal features 40 penetrate through dielectric passivation layer 34 to electrically connect to III-V compound layer 28 and 2DEG 30, for example, through inter-metallic compound 41.

Figure 14:
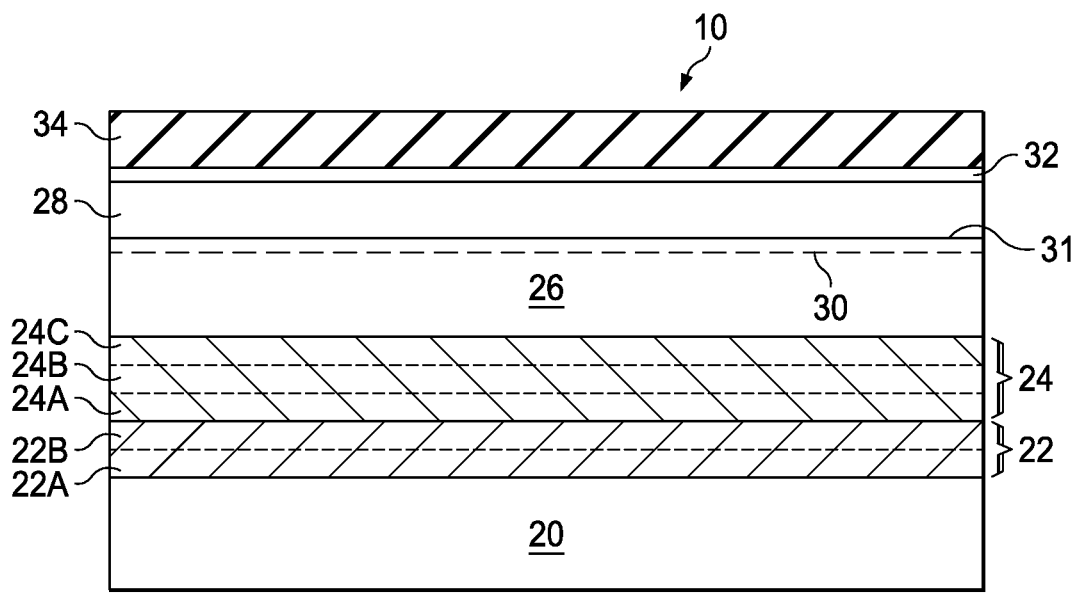
Figure 15:
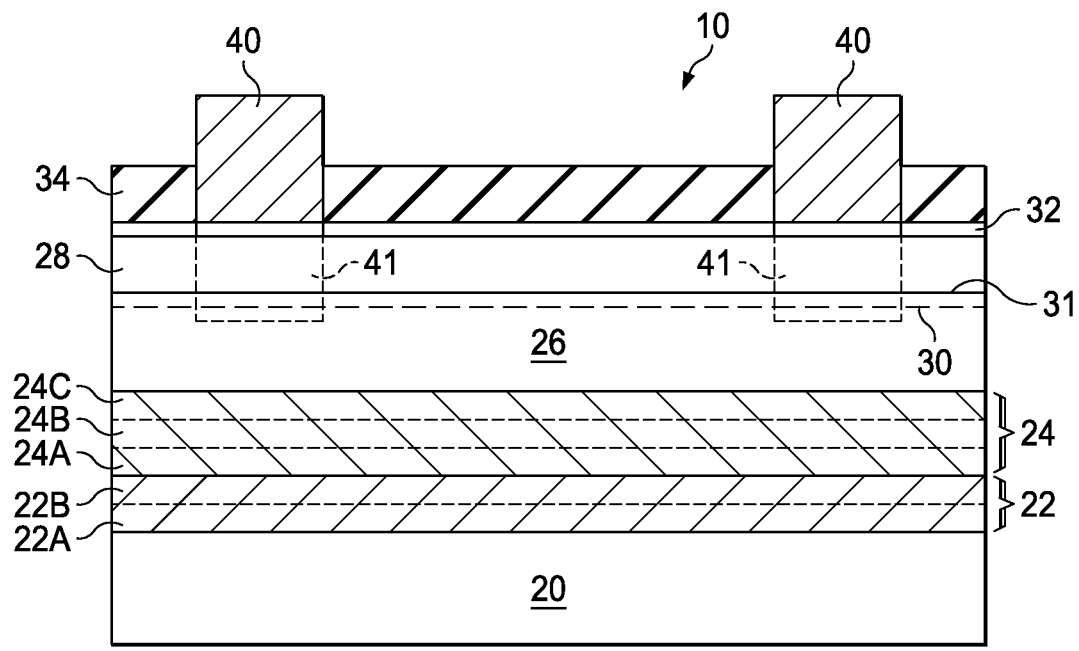

FIGS. 14 through 17 illustrate cross-sectional views of intermediate stages in the formation of an HEMT using a gate last approach. The initial steps of these embodiments are essentially the same as shown in FIGS. 1 through 5, and hence the details of the formation processes are not repeated herein. Next, as shown in FIG. 14, dielectric passivation layer 34 is formed over, and may be in contact with, crystalline interfacial layer 32. In FIG. 15, metal features 40 are formed. Metal features 40 penetrate through dielectric passivation layer 34 and crystalline interfacial layer 32 to electrically connect to III-V compound layer 28 and 2DEG 30, for example, through inter-metallic compound 41. Although FIG. 15 illustrates inter-metallic compound 41, inter-metallic compound 41 may not be formed at this stage, and may be formed as a result of the subsequent thermal processes.

Figure 16:
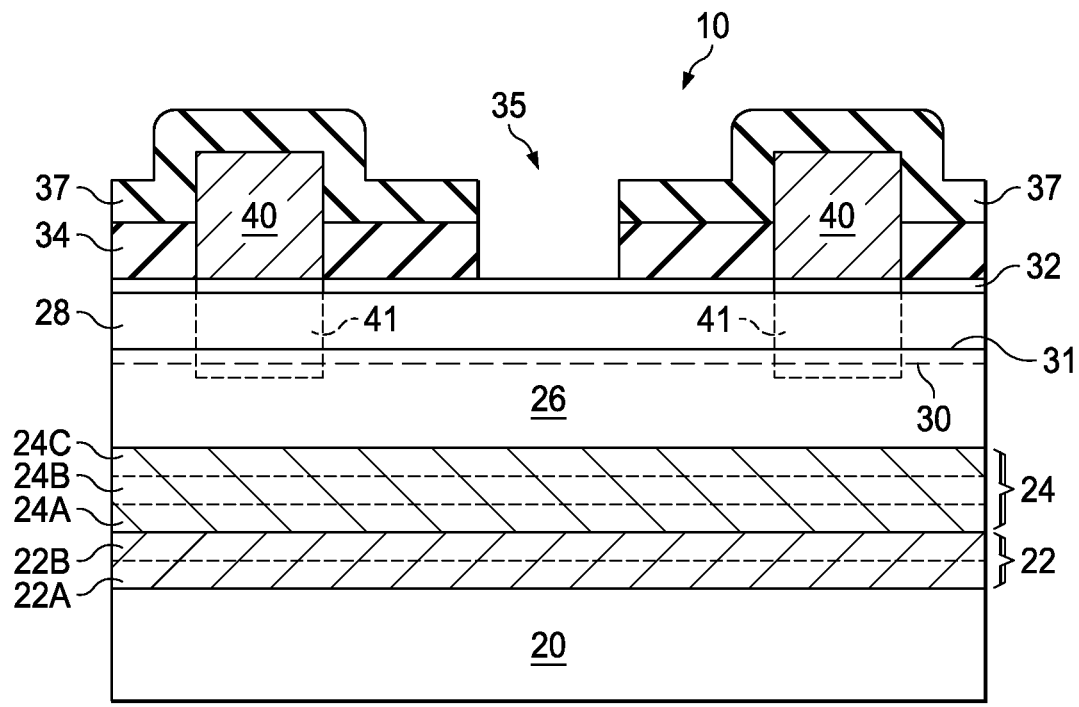

Next, referring to FIG. 16, dielectric capping layer 37 is formed. In some embodiments, dielectric capping layer 37 comprises an oxide, a nitride, or multi-layers thereof. Dielectric capping layer 37 comprises portions overlapping metal features 40, and portions over dielectric passivation layer 34. Next, a patterning step is performed on dielectric capping layer 37 and dielectric passivation layer 34 and opening 35 is formed as a result of the patterning. The top surface of crystalline interfacial layer 32 is exposed through opening 35.

Figure 17:
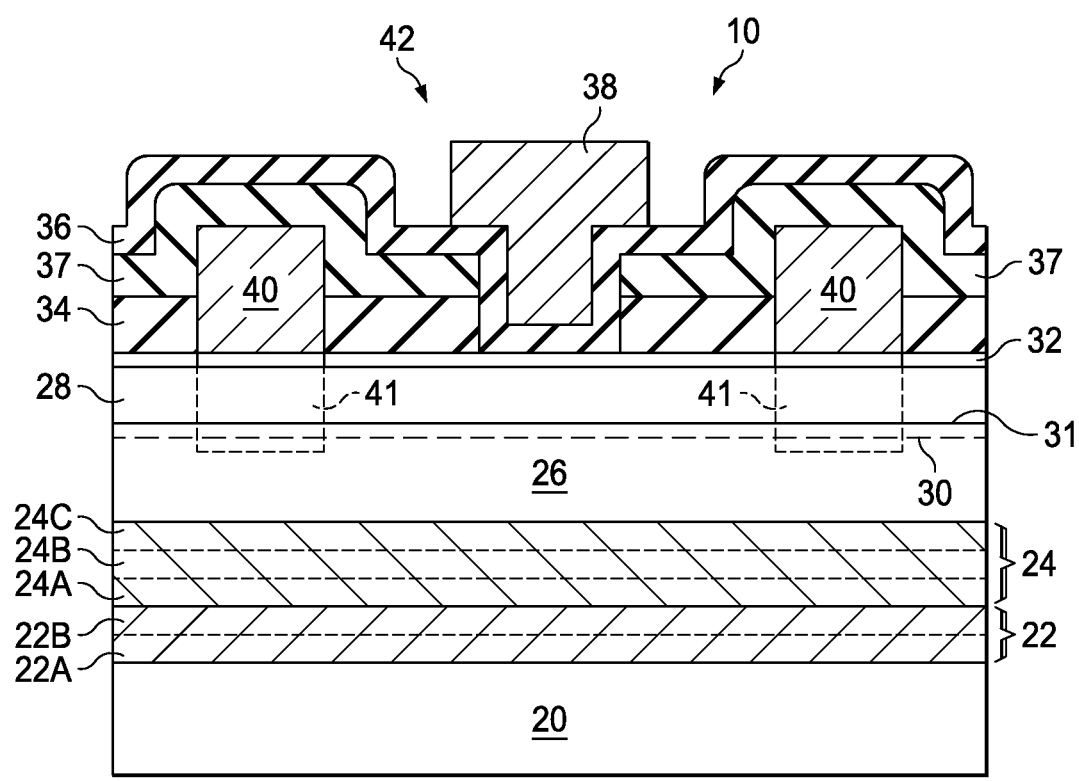

Next, as shown in FIG. 17, gate dielectric layer 36 and gate electrode layer 38 are formed. Gate dielectric layer 36 extends into opening 35 (FIG. 16). Furthermore, gate dielectric layer 36 comprises a first portion in opening 35 and in contact with crystalline interfacial layer 32, second portions on the edges of dielectric capping layer 37 and dielectric passivation layer 34, and third portions overlapping dielectric capping layer 37, dielectric passivation layer 34, and metal features 40. Gate electrode 38 also extends into opening 35 (FIG. 16). In subsequent steps (not shown), Inter-Layer Dielectric (not shown) may be formed to cover the structure in FIG. 17, and contact plugs (not shown) may be formed to electrically couple to gate electrode 38 and meta features 40. The formation of HEMT 42 is thus finished.

HEMTs 42 formed in accordance with the embodiments of the present disclosure include crystalline interfacial layer 32 (FIGS. 9, 13, and 17), and gate dielectric 36 over and contacting crystalline interfacial layer 32. In conventional HEMT formation processes, although gate dielectrics may be used to separate gate electrodes and the underlying semiconductor materials to reduce leakage currents, the Dit at the interfaces between the gate dielectrics and the respective underlying semiconductors is very high. The high Dit results in a very high threshold voltage (Vt) shift, which may be as high as 4 volts or higher. Therefore, the formation of gate dielectrics was not advantageous. By inserting the crystalline interfacial layer 32 (FIGS. 9, 13, and 17), which has a good crystalline structure and good bonding between atoms, the semiconductor material (such as layer 28 in FIGS. 9, 13, and 17) is in contact with the crystalline interfacial layer 32 that has the good crystalline structure, and hence the Dit at the interface between layer 28 and layer 32 is low. As a comparison, if crystalline interfacial layer 32 is not formed, gate dielectric 36 would have been in contact with the underlying layer 28, and the respective interface has a much higher Dit, and in turn causes a much higher Vt shift.

In accordance with some embodiments, an HEMT includes a first III-V compound layer having a first band gap, and a second III-V compound layer having a second band gap over the first III-V compound layer. The second band gap is greater than the first band gap. A crystalline interfacial layer is overlying and in contact with the second III-V compound layer. A gate dielectric is over the crystalline interfacial layer. A gate electrode is over the gate dielectric. A source region and a drain region are over the second III-V compound layer, and are on opposite sides of the gate electrode.

In accordance with other embodiments, an HEMT includes a first III-V compound layer, a second III-V compound layer over the first III-V compound layer, and a crystalline interfacial layer over and in contact with the second III-V compound layer. A dielectric passivation layer is over the crystalline interfacial layer. A gate dielectric includes a portion penetrating through the dielectric passivation layer to contact a top surface of a portion of the crystalline interfacial layer. A gate electrode is over the gate dielectric. A source region and a drain region are over the second III-V compound layer and on opposite sides of the gate electrode.

In accordance with yet other embodiments, a method of forming an HEMT includes epitaxially growing a first III-V compound layer, epitaxially growing a second III-V compound layer over the first III-V compound layer, and growing a crystalline interfacial layer over and in contact with the second III-V compound layer. The method further includes forming a gate electrode over the III-V compound layer, and forming a source region and a drain region over the second III-V compound layer and on opposite sides of the gate electrode.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A High Electron Mobility Transistor (HEMT) comprising:
   a first III-V compound layer having a first band gap;
   a crystalline starting layer having a crystalline structure over and in contact with the first III-V compound layer;
   a gate dielectric over the crystalline starting layer;
   a gate electrode over the gate dielectric; and
   a source region and a drain region in contact with the first III-V compound layer and on opposite sides of the gate electrode.

2. The HEMT of claim 1 further comprising a second III-V compound layer having a second band gap underlying and in contact with the first III-V compound layer, wherein the second band gap is smaller than the first band gap.

3. The HEMT of claim 2 further comprising a Two-Dimensional Electron Gas (2DEG) in the second III-V compound layer.

4. The HEMT of claim 1, wherein the crystalline starting layer is a dielectric layer.

5. The HEMT of claim 4, wherein the gate dielectric is an amorphous dielectric layer.

6. The HEMT of claim 1, wherein the crystalline starting layer is a semiconductor layer with a third band gap higher than the first band gap.

7. The HEMT of claim 1, wherein the gate electrode, the gate dielectric, and the crystalline starting layer are co-terminus, with edges of the crystalline starting layer aligned to respective edges of the gate electrode and the gate dielectric.

8. The HEMT of claim 1, wherein the crystalline starting layer comprises:
   a first portion overlapped by the gate dielectric and the gate electrode; and
   second portions misaligned with the gate dielectric and the gate electrode.

9. The HEMT of claim 1 further comprising a dielectric passivation layer over the first III-V compound layer, wherein the source region and the drain region penetrate through the dielectric passivation layer.

10. A High Electron Mobility Transistor (HEMT) comprising:

a first III-V compound layer;
a crystalline starting layer having a crystalline structure over and in contact with the first III-V compound layer;
a dielectric passivation layer over the crystalline starting layer;
a gate dielectric comprising a portion penetrating through the dielectric passivation layer to contact a top surface of a portion of the crystalline starting layer;
a gate electrode over the gate dielectric; and
a source region and a drain region in contact with the first III-V compound layer and on opposite sides of the gate electrode.

11. The HEMT of claim 10 further comprising a second III-V compound layer underlying the first III-V compound layer, with a Two-Dimensional Electron Gas (2DEG) formed in the second III-V compound layer.

12. The HEMT of claim 10, wherein the crystalline starting layer is a dielectric layer, and the gate dielectric has an amorphous structure.

13. The HEMT of claim 10, wherein the crystalline starting layer has a single-crystalline structure.

14. The HEMT of claim 10, wherein the crystalline starting layer has a poly-crystalline structure.

15. A method of forming a High Electron Mobility Transistor (HEMT), the method comprising:
epitaxially growing a first III-V compound layer;
growing a crystalline starting layer having a crystalline structure over and in contact with the first III-V compound layer, wherein the crystalline starting layer is a dielectric layer;
forming a gate dielectric over the crystalline starting layer;
forming a gate electrode over the gate dielectric; and
forming a source region and a drain region on opposite sides of the gate electrode, wherein the source region and the drain region are electrically coupled to the first III-V compound layer.

16. The method of claim 15 further comprising, before the epitaxially growing the first III-V compound layer, epitaxially growing a second III-V compound layer, with the first III-V compound layer being over and contacting the second III-V compound layer.

17. The method of claim 15, wherein the growing the crystalline starting layer comprises:
growing a dielectric material having an amorphous or a poly-crystalline; and
performing an anneal to crystallize the dielectric material into the crystalline starting layer.

18. The method of claim 15, wherein the growing the crystalline starting layer comprises growing a dielectric III-V compound material.

19. The method of claim 15, wherein the epitaxially growing the first III-V compound layer and the growing the crystalline starting layer are in-situ performed in a same process chamber.

20. The method of claim 15 further comprising:
before the forming the gate dielectric, forming a dielectric passivation layer over and contacting the first III-V compound layer; and
before the forming the gate dielectric, patterning the dielectric passivation layer to form an opening, wherein a portion of the crystalline starting layer is exposed through the opening, wherein the gate dielectric extends into the opening.

* * * * *